United States Patent [19]

Eguchi et al.

[11] Patent Number: 5,618,761
[45] Date of Patent: Apr. 8, 1997

[54] METHOD OF MANUFACTURING A PEROVSKITE THIN FILM DIELECTRIC

[75] Inventors: Kazuhiro Eguchi, Yokohama; Masahiro Kiyotoshi, Sagamihara; Keitaro Imai, Kawasaki, all of Japan

[73] Assignee: Kabushiki Kaisha Toshiba, Kawasaki, Japan

[21] Appl. No.: 526,387

[22] Filed: Sep. 11, 1995

[30] Foreign Application Priority Data

Sep. 16, 1994 [JP] Japan ................................. 6-221446
Mar. 9, 1995 [JP] Japan ................................. 7-050104

[51] Int. Cl.$^6$ ................................. H01L 21/02
[52] U.S. Cl. ................... 438/785; 427/226; 427/126.3
[58] Field of Search ................... 437/235, 243; 427/126.3, 226, 255.3, 376.2

[56] References Cited

U.S. PATENT DOCUMENTS

| | | | |
|---|---|---|---|
| 5,006,363 | 4/1991 | Fujii et al. ................................. | 427/39 |
| 5,164,363 | 11/1992 | Eguchi et al. . | |
| 5,258,204 | 11/1993 | Wernberg et al. ................................. | 427/255 |
| 5,434,742 | 7/1995 | Saito et al. ................................. | 361/321.5 |
| 5,442,585 | 8/1995 | Eguchi et al. ................................. | 365/149 |

OTHER PUBLICATIONS

Takaaki Kawahara et al., Step Coverage and Electrical Properties of (Ba, Sr)TiO$_3$ Films Prepared by Liquid Source Chemical Vapor Deposition Using TiO(DPM)$_2$; Jpn. J. Appl. Phys. vol. 33 (1994) pp. 5129–5134 Part 1, No. 9B, Sep. 1994.

Jiming Zhang et al., Photoenhanced Chemical–Vapor Deposition of BaTiO$_3$; Appl. Phys. Lett. 65 (19), Nov. 7, 1994, pp. 2410–2412.

Primary Examiner—Robert Kunemund
Assistant Examiner—Matthew Whipple
Attorney, Agent, or Firm—Oblon, Spivak, McClelland, Maier & Neustadt, P.C.

[57] ABSTRACT

Disclosed is a method of manufacturing a semiconductor device, comprising the step of forming a dielectric thin film on a semiconductor layer, the dielectric thin film being made of a compound represented by the general formula (1) given below:

$$ABO_3 \quad (1)$$

where "A" is at least one element selected from the group consisting of Ca, Ba, Sr, Pb and La, and "B" is at least one element selected from the group consisting of Zr and Ti, The dielectric thin film being formed by a chemical vapor deposition under a pressure of 400 Torr or less and a temperature of 1,000° C. or less by using a raw material gas containing a complex compound of element A with a β-diketone, a complex compound of element B with a β-diketone, and an oxidizing agent.

7 Claims, 7 Drawing Sheets

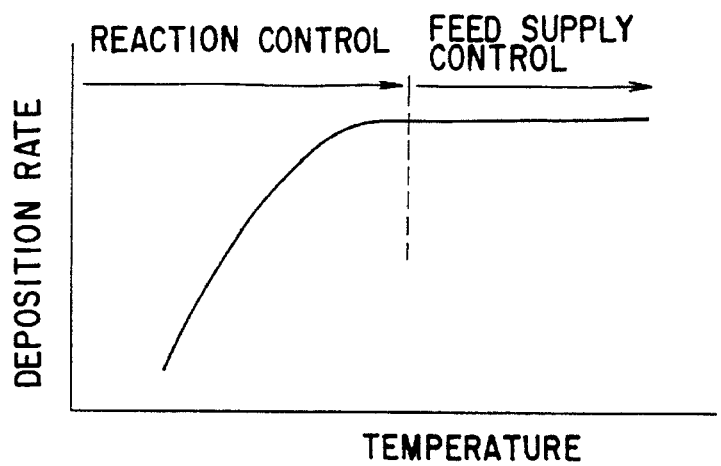
F I G. 1
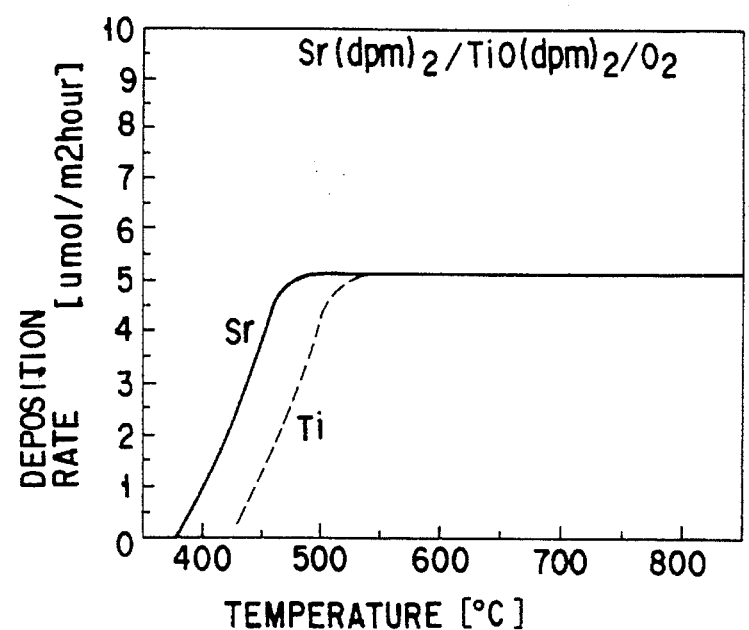
F I G. 2
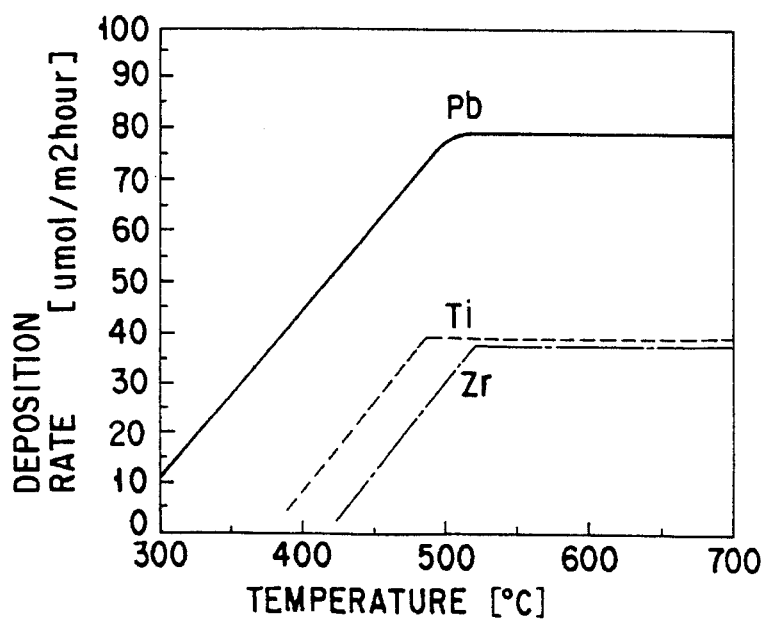
F I G. 3

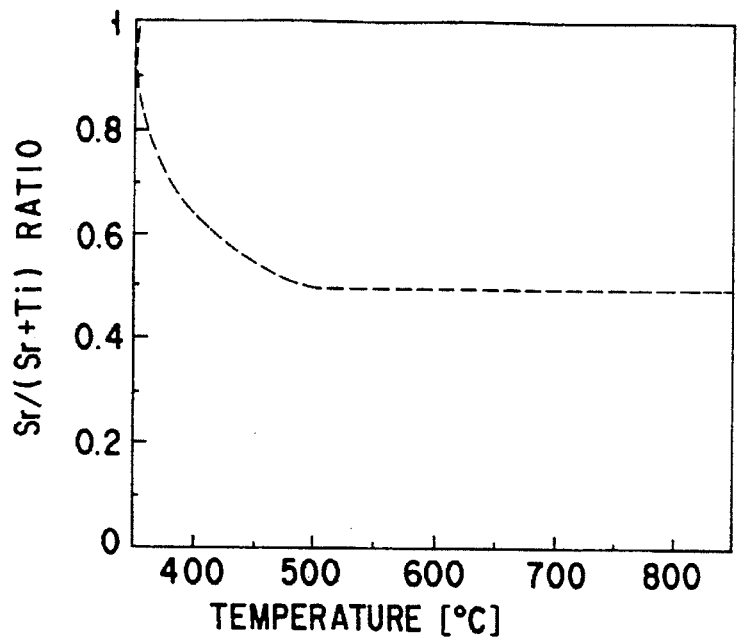
F I G. 7
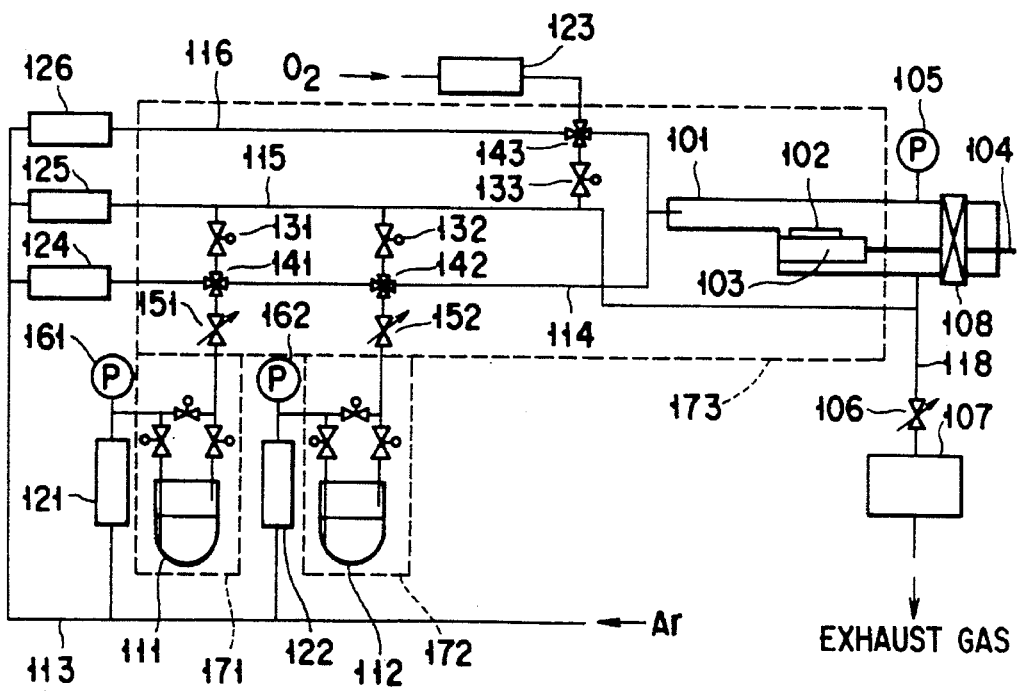
F I G. 8

METHOD OF MANUFACTURING A PEROVSKITE THIN FILM DIELECTRIC

BACKGROUND OF THE INVENTION

1. Field of the Invention

The present invention relates to a method of manufacturing a semiconductor device such as DRAM comprising a capacitor, particularly, to a method of forming a capacitor insulating film (electric charge accumulating film) included in such a semiconductor device.

2. Description of the Related Art

A capacitor is an important element included in a semiconductor integrated circuit. For example, a transistor and a capacitor are used in combination in a dynamic random access memory (DRAM), which is a kind of a semiconductor memory device, so as to perform writing and reading of data. A capacitor is also used widely as an element for accumulating electric charges in another semiconductor integrated circuit.

A capacitor included in a semiconductor integrated circuit comprises a lower electrode provided by a semiconductor substrate or a conductor formed on the substrate, a capacitor insulating film laminated on the lower electrode, and an upper electrode laminated on the insulating film. It was customary in the past to use a silicon oxide ($SiO_2$) or silicon nitride ($Si_3N_4$) for forming the capacitor insulating film included in the capacitor used in an integrated circuit.

With a rapid progress nowadays in the integration density of the semiconductor device and in the storing capacity of the memory device, it is required to form a capacitor having a large capacitance, i.e., a large accumulating capacity of electric charges in a small planar region. A first means to meet this requirement is that the thickness of the capacitor insulating film is decreased so as to increase the capacitance per effective unit area. A second means is to employ a three dimensional structure so as to increase the effective surface area of the capacitor. The second means includes, for example, a trench capacitor technique and a stacked capacitor technique. In the trench capacitor technique, a trench is formed on the lower electrode, e.g., a silicon substrate, to form a capacitor along the surface of the trench, thereby increasing the effective area of the capacitor. When it comes to the stacked capacitor technique, a plurality of capacitors are formed in a stacked fashion on a transistor so as to ensure a large capacitor area without sacrificing the degree of integration.

However, serious problems remain unsolved in the conventional techniques exemplified above. Specifically, a leakage current is increased with decrease in the thickness of the capacitor insulation film, making it impossible to decrease the thickness of the film to a level exceeding a certain level. It is also technically difficult to achieve a three dimensional structure of a further complex structure. It follows that it is difficult to provide a DRAM having a higher degree of integration as far as silicon oxide or silicon nitride is used for forming the capacitor insulating film. As a matter of fact, a DRAM having a degree of integration exceeding a level of giga bits has not yet been developed.

Under the circumstances, in order to achieve a further improved fineness and to further improve the integration density, it is absolutely necessary to use a dielectric material having a dielectric constant higher than that of the conventional insulating film for forming the capacitor insulating film. In recent years, it is studied to use high dielectric constant materials having a perovskite crystal structure such as strontium titanate ($SiTiO_3$), barium strontium titanate ($Ba_xSr_{1-x}TiO_3$), and PZT ($PbZr_xTi_{1-x}O_3$), said highly dielectric materials having a dielectric constant higher than that of $SiO_2$ or $Si_3N_4$. The dielectric constant of these high dielectric constant materials is 20 to 1,000 times as high as that of silicon oxide ($SiO_2$).

However, it is necessary to solve the problems given below in using these high dielectric constant materials of perovskite crystal structure for forming a capacitor insulating film.

In general, a highly dielectric film has a narrow forbidden band, with the result that a leakage current tends to flow when a voltage is applied to the film. It follows that, if the thickness of the high dielectric constant film is decreased in using the film for the capacitor insulating film of a DRAM in order to ensure a required capacitance, the leak current tends to be excessively increased. It should also be noted that the dielectric constant of a high dielectric constant film having a perovskite crystal structure tends to be lowered, if the thickness of the film is decreased. It follows that, even if the film is made thinner, the capacitance thereof is not sufficiently increased. Such being the situation, it is impossible to obtain a sufficiently large capacitance by simply using the high dielectric constant materials exemplified above for forming the capacitor insulating film, making it necessary to employ a three dimensional structure as in the trench capacitor technique and the stacked capacitor technique.

In employing a three dimensional structure, it is necessary to form a high dielectric constant thin film with a good step coverage on a surface having a recess or projection. However, the sputtering technique used in the conventional technique of forming a high dielectric constant thin film is incapable of forming such a thin film with a good step coverage. This makes it necessary to employ a chemical vapor deposition (CVD) method, which permits forming a thin film with a good step coverage, for forming the high dielectric constant thin film in place of the sputtering method. However, it is impossible to form uniformly by the known CVD method a thin film of the high dielectric constant material, which is a complex oxide compound, on a substrate having stepped portions with a good step coverage. Thus, it is difficult to form a capacitor of three dimensional structure by using a high dielectric constant thin film as a capacitor insulating film. As a result, the degree of integration achieved in the semiconductor device comprising a capacitor insulating film made of a highly dielectric material is not so high as that achieved in the semiconductor device comprising a capacitor insulating film made of $SiO_2$ or $Si_3N_4$.

To be more specific, an MOCVD (metal organic CVD) method using an organometalic compound as a raw material is employed, in general, for forming a metal oxide film by CVD method. The high dielectric constant material having a perovskite crystal structure, which is certainly a metal oxide, consists of several kinds of metal oxides. As a result, serious problems are generated as described below in the case of employing an MOCVD for forming a thin film of the high dielectric constant material. Specifically, in order to form a thin film having a high dielectric constant as desired, it is absolutely necessary to form the film such that the crystal structure of perovskite type is not disturbed. To meet this requirement, it is necessary to control the deviation of the crystal composition from the stoichiometric ratio to fall within a range of ±10%. Where it is necessary to control accurately the composition of the complex oxide film, the MOCVD is performed under mass transport limited conditions in which the thin film deposition rate is determined by the feed supply rate. Under the mass transport limited conditions, the thermal decomposition of the feed material is performed at a high rate, with the result that the thin film deposition rate is rendered proportional to the feed supply rate of the raw materials. It follows that the composition of the deposited complex oxide can be controlled accurately by accurately controlling the feed supply rate of each raw material during CVD performed under the mass transport limited conditions. The feed supply rate of each raw material can be controlled by accurately controlling the CVD conditions such as the raw material temperature, pressure in the raw material container, and flow rate of the raw material bubbling gas. The particular method is employed for forming dielectric thin films such as a film of $Ba_xSr_{1-x}TiO_3$ and high temperature superconductor films such as a film of $YBa_2Cu_3O_{7-d}$.

The film composition can be controlled accurately by the CVD method performed under the mass transport limited conditions, as described above. However, the particular CVD method is not satisfactory in the step coverage of the deposited film. Specifically, under the mass transport limited conditions, the raw material is not expanded sufficiently on the surface of a substrate but is subjected to decomposition reaction immediately after reaching the substrate surface. It follows that, where the substrate has, for example, a trench structure on the surface, it is impossible to obtain a film of a uniform thickness because the raw material easily reaches some portions to deposit, but is unlikely to reach other portions of the trench structure. Such being the situation, the MOCVD under the mass transport limited conditions fails to achieve the object of employing a three dimensional structure such as a trench capacitor and a stacked capacitor, resulting in failure to comply with the demands in the giga bits generation.

SUMMARY OF THE INVENTION

An object of the present invention is to provide a method of manufacturing a semiconductor device comprising a capacitor insulating thin film made of a high dielectric constant compound having a dielectric constant higher than that of the conventional material such as $SiO_2$ or $Si_3N_4$, the highly dielectric compound including, for example, $SrTiO_3$, $Ba_xSr_{1-x}TiO_3$ and PZT, particularly, a method which permits forming a thin film of the high dielectric constant compound on a substrate in a uniform thickness and which also permits forming a thin film on a substrate having stepped portions with a good step coverage.

The method of the present invention makes it possible to form capacitors of a three dimensional structure such as a trench capacitor and a stacked capacitor by using a high dielectric constant thin film as a capacitor insulating film, leading to manufacture of a semiconductor device having an improved degree of integration.

The present inventors have made an extensive research and found that, even in the case of using a highly dielectric material such as $SrTiO_3$, $Ba_xSr_{1-x}TiO_3$, or PZR, it is possible to form a thin film of a uniform thickness on a substrate having a stepped surface by carrying out CVD such that a particular raw material is selected, and that the raw material is not decomposed within a gas phase but is allowed to reach the substrate surface so as to be sufficiently expanded on the substrate surface.

According to the present invention, there is provided a method of manufacturing a semiconductor device, comprising the step of forming a dielectric thin film on a semiconductor layer, the dielectric thin film being made of a compound represented by the general formula (1) given below:

$$ABO_3 \qquad (1)$$

where "A" is at least one element selected from the group consisting of Ca, Ba, Sr, Pb and La, and "B" is at least one element selected from the group consisting of Zr and Ti, the dielectric thin film being formed by a chemical vapor deposition under a pressure of 400 Torr or less and a temperature of 1,000° C. or less by using a raw material gas containing a β-diketone complex compound of the element A, a β-diketone complex compound of the element B, and an oxidizing agent.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a graph showing the relationship between the deposition rate and the deposition temperature, said graph being intended to explain the terms "kinetically limited conditions" and "mass transport limited conditions" used in this specification;

FIG. 2 is a graph showing the temperature dependence of a Sr deposition rate and a Ti deposition rate in the case of supplying predetermined amounts of a Sr raw material and a Ti raw material into a CVD chamber for forming a $SrTiO_3$ film;

FIG. 3 is a graph showing the temperature dependence of a Pb deposition rate, a Ti deposition rate, and a Zr deposition rate in the case of supplying predetermined amounts of a Pb raw material, a Ti raw material, and a Zr raw material into a CVD chamber for forming a PZT film;

FIG. 7 is a graph showing how the ratio of Sr/(Sr+Ti) in the deposited film depends on the film forming temperature in the case of forming a strontium titanate film by CVD while supplying the raw material such that the Sr/(Sr+Ti) ratio in the raw material gas is 0.5;

FIG. 8 schematically shows the construction of a chemical vapor deposition apparatus used for forming a dielectric thin film in one embodiment of the present invention;

DETAILED DESCRIPTION OF THE PREFERRED EMBODIMENTS

Figure 4:
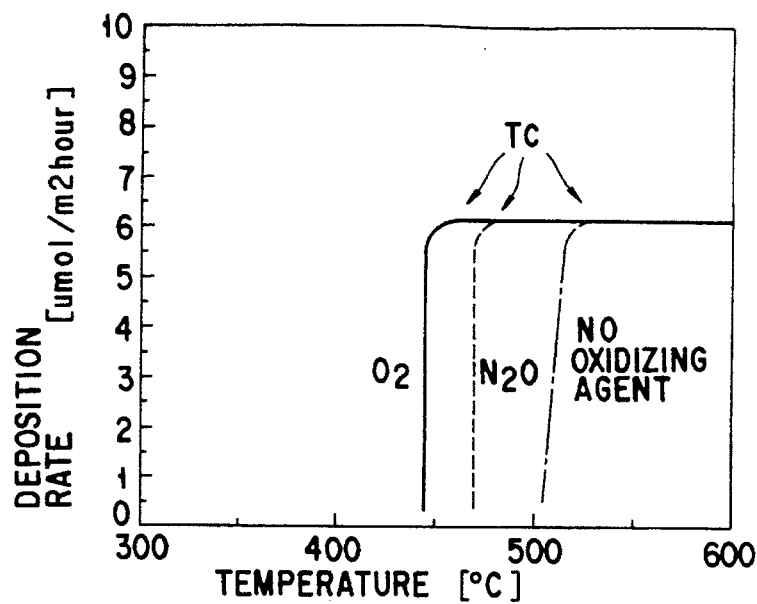
FIG. 4 is a graph showing how the decomposition temperature Tc of $Sr(DPM)_2$ within a gas phase may be affected by the presence of an oxidizing agent.

The present invention provides a method of manufacturing a semiconductor device, comprising the step of forming a dielectric thin film on a semiconductor layer, said dielectric thin film being made of a compound represented by the general formula (1) given below:

$$ABO_3 \qquad (1)$$

where "A" is at least one element selected from the group consisting of Ca, Ba, Sr, Pb and La, and "B" is at least one element selected from the group consisting of Zr and Ti, said dielectric thin film being formed by a chemical vapor deposition under a pressure of 400 Torr or less and a temperature of 1,000° C. or less by using a raw material gas containing a β-diketone complex compound of said element A, a β-diketone complex compound of said element B, and an oxidizing agent.

The compounds represented by the general formula of ABO$_3$, i.e., formula (1) given above, include, for example, not only SrTiO$_3$, Ba$_x$Sr$_{1-x}$TiO$_3$ and PZT, which are mentioned previously but also Pb$_{1-x}$La$_x$Zr$_y$Ti$_{1-y}$O$_3$ (0≦x≦1; 0≦y≦1).

In the present invention, a dielectric thin film made of a compound represented by ABO$_3$ is formed by a chemical vapor deposition (CVD) method by using a raw material containing a β-diketone complex compound of element A, a β-diketone complex compound of element B, and an oxidizing agent. The conventional CVD process can be employed for forming the particular dielectric thin film.

The β-diketone as the ligand are not particularly limited in the complex compounds used as the raw material in the CVD. For example, the β-diketone compounds used as the ligand in the present invention include:

dipivaloylmethane (DPM; C$_{11}$H$_{19}$O$_2$, i.e., 2,2,6,6-tetramethyl-3,5-heptanedione), and hexafluoroacetylacetone (HFA; C$_5$HF$_6$O$_2$).

The oxidizing agents used in the present invention, which are not particularly limited, include, for example, O$_2$, N$_2$O, NO$_2$, NO, O$_3$, furan (C$_4$H$_4$O), and tetrahydrofuran (C$_4$H$_8$O). These gases may be activated with plasma or light for providing an oxidizing agent used in the present invention. It is desirable to use an oxygen gas (O$_2$) because the oxygen gas can be used easily to obtain a sufficient effect. It is more desirable to use N$_2$O because N$_2$O permits further suppressing the decomposing reaction of the raw material in a gas phase so as to produce a prominently high effect.

In the present invention, the CVD process should be carried out under a pressure of 400 Torr or less and a temperature of 1,000° C. or less, preferably under a pressure of 100 Torr or less and a temperature of 700° C. or less. If the pressure exceeds 400 Torr, it is difficult to suppress the decomposition of the raw material in a gas phase no matter how the other process conditions may be set. On the other hand, if the reaction temperature exceeds 1,000° C., the raw material compound is allowed to react immediately with the substrate without sufficient spread over the substrate. If any of the pressure and temperature fails to meet the condition specified above, it is difficult to obtain a thin film of a uniform thickness. It is desirable to set appropriately the specific pressure and temperature to enable the high dielectric constant thin film to be formed at a deposition rate determined by reaction (i.e. under kinetically limited conditions).

In a preferred embodiment of the present invention, the CVD process should be carried out under temperatures lower than the thermal decomposition temperature of any of the β-diketone complex compounds of elements A and B. In this case, it is possible to improve the step coverage of the resultant thin film of the highly dielectric material. In addition, the smoothness on the surface of the formed film can be improved.

In another preferred embodiment of the present invention, the raw material supply in the CVD process should be controlled such that the molar amount of the β-diketone complex compound of element B (i.e., Zr and/or Ti) should be at least 5 times as much as that of the β-diketone complex compound of element A (i.e., Ca, Ba, Sr, Pb and/or La). In this case, it is possible to improve the crystallinity and dielectric constant of the resultant thin film of the highly dielectric constant material.

Of course, the two preferred embodiments described above can be employed in combination.

What is most important in the present invention is that β-diketone complex compounds of elements A and B specified in the present invention should be used in the CVD process as sources of metals, and that the CVD process should be carried out under a pressure of 400 Torr or less and a temperature of 1,000° C. or less. Where organometalic compounds other than those specified above are used as sources of metals in the CVD process, or where the CVD conditions do not fall within the scope of the present invention, it is impossible to obtain a good step coverage as desired.

The CVD conditions specified in the present invention denote, in functional aspects thereof, that the thin film of a high dielectric constant material should be formed under the kinetically limited conditions. Attentions should be paid in this connection to a graph of FIG. 1 showing the relationship between the deposition rate of a film and the deposition temperature in the CVD process. In this graph, the deposition rate is plotted on the ordinate, with the deposition temperature being plotted on the abscissa. It is seen that the deposition rate is proportional to the deposition temperature before the deposition temperature reaches a certain level. Also, the deposition rate is rendered constant after the deposition temperature exceeds the certain level noted above. The reacting conditions corresponding to the region where the graph has a constant gradient in FIG. 1, i.e., the region where film deposition rate is proportional to the deposition temperature, are called kinetically limited conditions. Under the kinetically limited conditions, the raw material is decomposed at a low rate, with the result that the raw material after arrival at the substrate surface is enabled to be diffused or spread a sufficiently long distance before the raw material begins to be thermally decomposed. As a result, a high dielectric constant film is deposited uniformly even on a portion where the raw material is difficult to directly reach. It follows that the formed film is rendered uniform in thickness, and a step coverage is improved even on a substrate having a stepped portion on the surface.

FIG. 2 shows the temperature dependence of a Sr deposition rate and a Ti deposition rate in the case of supplying predetermined amounts of a Sr raw material and a Ti raw material into a CVD chamber for forming a $SrTiO_3$ film. It is clearly seen that the Sr deposition rate and the Ti deposition rate are proportional to temperature where the surface temperature of the substrate is lower than about 480° C. and 520° C. respectively. FIG. 3 shows a similar graph in respect of a PZT film formation. In this case, Pb, Ti and Zr films are formed under the kinetically limited conditions at the deposition temperatures equal to or lower than 510° C., 480° C. and 520° C. respectively.

It is certainly possible to increase the supply amount of the raw material gas in order to carry out the CVD process under the kinetically limited conditions. In addition, what is particularly effective is to lower the deposition temperature so as to suppress the decomposition of the raw material on the substrate surface, as apparent from FIGS. 2 and 3. It should be noted, however, that, if the deposition temperature is lowered, the surface smoothness of the resultant film tends to be impaired, though it is certainly possible to improve the step coverage. For example, in the case of using β-diketone complex compounds of IIa group elements such as Sr, Ba or Ca, the surface smoothness of the resultant thin film is markedly impaired in the case of lowering the deposition temperature. The thin film poor in its surface smoothness is unsuitable for use as a capacitor insulating film in LSI.

As a result of an extensive research, the present inventors have found that the organometalic compound is partly decomposed in a gas phase even under the kinetically limited conditions so as to impair the surface smoothness of the resultant film.

Figure 5:
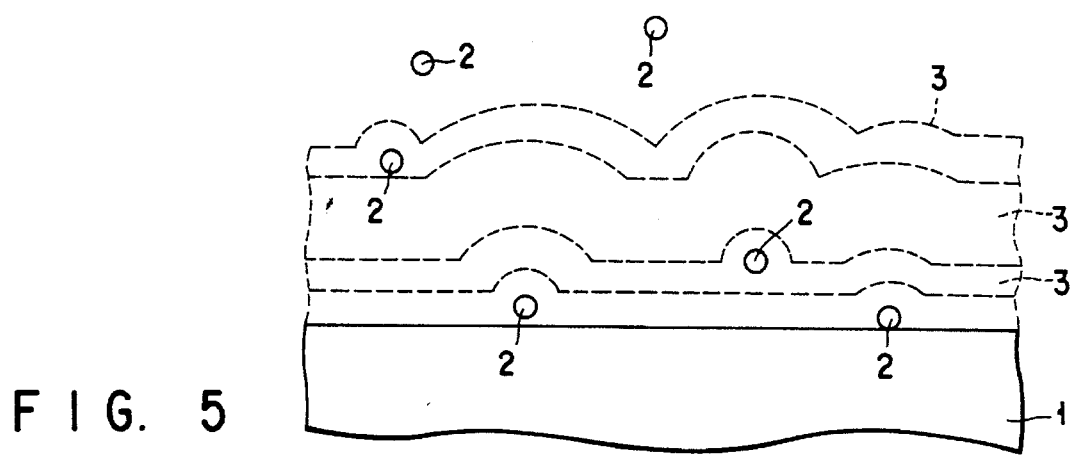
FIG. 5 shows how the surface smoothness of a thin film is deteriorated in the case of forming a highly dielectric thin film by CVD under the kinetically limited conditions.
Figure 6:
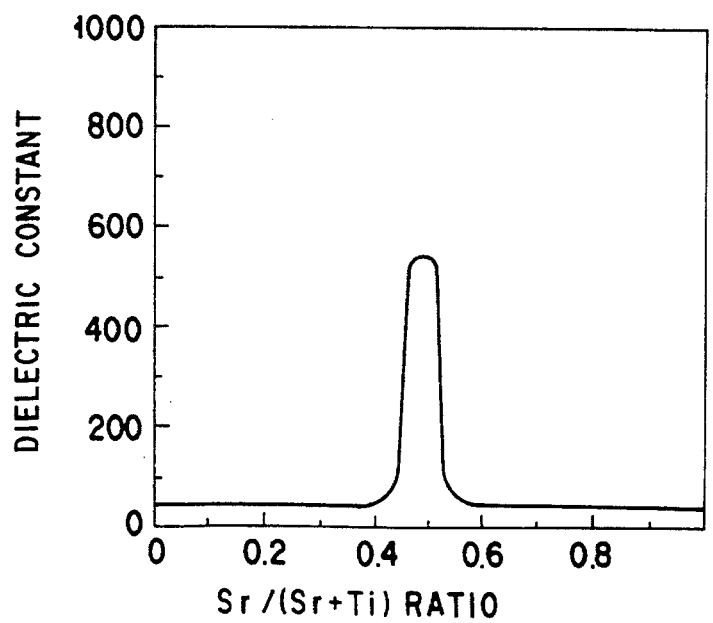
FIG. 6 is a graph showing how the dielectric constant of strontium titanate depends on composition of the compound.

Now it will be described in the case of the method of the present invention comprises the step of forming a dielectric thin film of a compound represented by the general formula $ABO_3$, where "A" denotes IIa group elements such as Sr and Ba. For forming the film, β-diketone complex compounds of elements A and B including, for example, DPM complex compounds of IIa group elements are used as raw materials. What should be noted is that the particular complex compounds exhibit decomposition temperatures inherent in the individual compounds. For example, the decomposition temperature Tc within a gas phase of $Sr(DPM)_2$ is as shown in FIG. 4. In this case, the decomposition temperature Tc is dependent on the kind of the oxidizing agent used. Anyhow, under temperatures higher than the decomposition temperature Tc, $Sr(DPM)_2$ is decomposed within a gas phase before the compound reaches the substrate surface. As a result, particles 2 formed by the decomposition within the gas phase are attached to the surface of a substrate 1, as shown in FIG. 5. Then, a high dielectric constant film 3 is deposited on the substrate surface with a good step coverage. As shown in FIG. 6, the presence of the particles 2 causes the surface smoothness of the resultant thin film to be impaired.

Under the circumstances, in a preferred embodiment of the present invention, it is not sufficient that the CVD process for forming a high dielectric constant thin film is carried out under the kinetically limited conditions in order to prevent the organometalic compound from being decomposed within a gas phase. Specifically, it is also required that the CVD process is carried out under temperatures lower than the thermal decomposition temperature Tc of any of the organometalic compounds used as the raw materials. As a result, it is possible to obtain a good step coverage and to improve the surface smoothness of the highly dielectric thin film. Incidentally, the decomposition temperature Tc is also dependent on conditions other than the deposition temperature. For example, the decomposition temperature Tc is also dependent on the inner pressure of the deposition chamber. It follows that it is necessary to determine first the decomposition temperature Tc of each of the organometalic compounds on the basis of the actual deposition conditions and, then, to set the deposition temperature at a level lower than the decomposition temperature Tc of any of the organic metal compounds determined previously.

In a still another preferred embodiment of the present invention, the molar amount of the β-diketone complex compound of the element B, i.e., Zr and/Ti, supplied to the deposition chamber should be controlled at least 5 times as much as the molar amount of the β-diketone complex compound of the element A, i.e., Ca, Ba, Sr, Pb or La, supplied to the film-forming chamber. If this requirement is satisfied, the resultant highly dielectric thin film is enabled to have a desired metal element composition, even where the deposition temperature is lowered such that the CVD process is carried out under the kinetically limited conditions. It follows that it is possible to form a highly dielectric thin film of high quality, which is excellent in its crystallinity.

To be more specific with respect to functional aspects thereof, when it comes to a high dielectric constant compound having a perovskite type crystal structure such as $SrTiO_3$ or $PbZr_xTi_{1-x}O_3$, it is possible to obtain a high dielectric constant as desired only in the case that the crystal structure of the compound assumes a correct perovskite structure, as described previously. Thus, in order to obtain a high dielectric constant as desired, it is necessary to control the metal element ratio within the complex oxide to fall within a range of ±10% of the stoichiometric ratio so as to form a perovskite crystal structure. For example, the dielectric constant of strontium titanate depends on the composition of the compound as shown in FIG. 6. As shown in FIG. 6, if the actual strontium ratio Sr/(Sr+Ti) is equal to a stoichiometric ratio of 0.5, the compound exhibits about 550 of a dielectric constant. However, if the actual strontium ratio widely deviates from the stoichiometric ratio, the compound fails to assume a perovskite crystal structure, with the result that the dielectric constant of the compound is as small as only about 30.

On the other hand, if a film of strontium titanate is formed by CVD while supplying raw materials such that the strontium ratio Sr/(Sr+Ti) within the raw material gas is controlled to be 0.5, the strontium ratio Sr/(Sr+Ti) within the film which is being deposited is changed depending on the depositing temperature as shown in FIG. 7. Where the depositing temperature is set at 600° C., the ratio Sr/(Sr+Ti) within the metal oxide film becomes 0.5. In other words, a good crystallinity can be obtained. However, if the depositing temperature is lowered in an attempt to achieve a good step coverage, the strontium ratio of the film is increased (or the titanium ratio is lowered), with the result that the formed film fails to exhibit a good crystallinity. It should be noted that, if a titanium raw material and an alkaline earth metal raw material are present together in a gas phase of a low temperature, the decomposition of the titanium raw material is suppressed. In this case, the reaction given below becomes predominant so as to bring about the phenomenon described above:

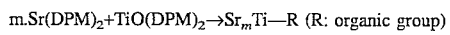

$m \cdot Sr(DPM)_2 + TiO(DPM)_2 \rightarrow Sr_m Ti-R$ (R: organic group)

In the case exemplified above, $Sr(DPM)_2$ is used as an alkaline earth metal raw material, with $TiO(DPM)_2$ being used as a titanium raw material. In this case, an ideal crystal structure can be obtained only where m is 1 (m=1). The conditions which permit such an ideal reaction to become predominant depend on conditions such as a deposition temperature. As a result of an extensive research, the present inventors have found that, in the CVD process under the kinetically limited conditions specified in the present invention, the ideal reaction noted above becomes predominant when the molar amount of the titanium raw material supplied to the deposition chamber is at least 5 times as much as that of the alkaline earth metal raw material supplied to the deposition chamber. It should be noted that the molar ratio of the raw materials noted above is equal to the partial pressure ratio of these materials.

As described above, it is possible to form a thin film having a good perovskite crystal structure exhibiting a high dielectric constant and excellent insulating properties by the CVD process carried out even under the kinetically limited conditions, if the molar amount the β-diketone complex compound of element B, i.e., Zr and/or Ti is controlled to be at least 5 times, more preferably, at least 10 times as much as that of the β-diketone complex compound of element A, i.e., Ca, Ba, Sr, Pb and/or La.

Let us describe some Examples of the present invention with reference to the accompanying drawings. Needless to say, however, a person skilled in the art will readily appreciate that the following Examples do not limit at all the technical scope of the present invention.

EXAMPLE 1

A thin film of strontium titanate ($SrTiO_3$) was formed on a Si substrate by a chemical vapor deposition at a film-forming temperature of 450° C., using $Sr(C_{11}H_{19}O_2)_2$ as a Sr raw material, $TiO(C_{11}H_{19}O_2)_2$ as a Ti raw material, and $O_2$ as an oxidizing agent.

FIG. 8 schematically shows the construction of the chemical vapor deposition apparatus used for forming the thin film. The apparatus comprises a reaction chamber for performing a chemical vapor deposition and a piping system for supplying the raw material gases, an oxidizing agent, etc. into the reaction chamber and for discharging the waste gas from within the reaction chamber. An argon gas is used as a carrier gas, and the supply and exhaust of the gases are controlled by operating various valves.

As shown in the drawing, an argon gas supply tube 113, which is connected to an argon gas supply source (not shown), is branched into two systems, one being connected to a raw material gas supply tube 114 via a mass flow rate controller 124, with the other being connected to an oxygen gas supply tube 116 via a mass flow rate controller 126. These two branched systems are introduced into a tube heating oven 173 so as to be connected to a reaction chamber 101. A gas discharge tube 118 connected to a vacuum pump 107 is connected to the reaction chamber 101 via a pressure control valve 106. On the other hand, a gas discharge tube 115, which is connected to the argon gas supply tube 113 via a mass flow rate controller 125, extends within the tube heating oven 173 so as to be connected directly to the discharge tube 118 and, thus, to form a gas discharge system of the apparatus.

The argon gas supply tube 113 is also branched into two additional systems, one being connected via a mass flow rate controller 121 and a pressure detector 161 to a raw material vessel 111 stored within a raw material heating oven 171, with the other being connected via a mass flow rate controller 122 and a pressure detector 162 to a raw material vessel 112 housed in a raw material heating oven 172. The raw material vessel 111 is connected to the raw material gas supply tube 114 via a pressure control valve 151 and a flow switching device 141 which is connected to the discharge tube 115 via a valve 131. Likewise, the raw material loading vessel 112 is connected to the raw material supply tube 114 via a pressure control valve 152 and a flow switching device 142 which is connected to the discharge tube 115 via a valve 132. The flow path is switched by these switching devices 141 and 142 so as to permit supplying a raw material gas into the reaction chamber 101 and also permit discharging the waste gas through the discharge tube 115. It should be noted that an oxygen gas supply source (not shown) is connected to the oxygen gas supply tube 116 via a mass flow rate controller 123 and a flow switching device 143 which is connected to the discharge tube 115 via a valve 133. As is the case with the raw material gas, the oxygen gas supply into the reaction chamber 101 and discharge into the discharge tube 115 is performed by switching the flow switching device 143. A gate valve 108 and a pressure detector 105 are mounted within the reaction chamber 101. Further, a resistance heater 103 comprising a thermocouple 104 is mounted within the reaction chamber 101. A substrate 102 on which a thin film is to be formed is disposed on the resistance heater 103 for the heating.

Figure 9:
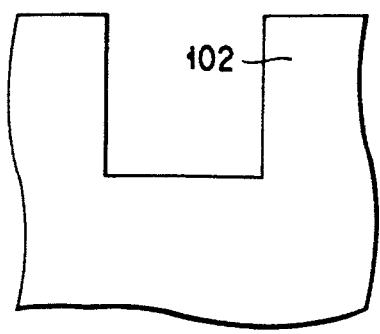
FIG. 9 is a cross sectional view showing a Si substrate before formation of a thin film in an example of the present invention.

A thin film was actually deposited by using the chemical vapor deposition apparatus of the construction described above. In the first step, a Si substrate 102 having a groove formed on the surface as shown in FIG. 9 was disposed on the resistance heater 103, followed by introducing an argon gas of a high purity into the reaction chamber 101 so as to substitute the argon gas for the air within the reaction chamber. Then, the pressure within the reaction chamber 101 was controlled at 10 Torr by operating the vacuum pump 107 while monitoring the pressure with the pressure detector 105, followed by supplying a high purity oxygen gas into the reaction chamber 101 through the mass flow rate controller 123. After supply of the oxygen gas, the Si substrate 102 was heated to 450° C. by the resistance heater 103. During the heating of the Si substrate 102, the argon gas streams whose flow rates were controlled by the mass flow rate controllers 121 and 122 were supplied at flow rates of 300 sccm and 30 sccm, respectively, into the raw material vessels 111 and 112 housing $Sr(C_{11}H_{19}O_2)_2$ and $TiO(C_{11}H_{19}O_2)_2$. The resultant gaseous streams were allowed to flow onto the downstream side through the gas supply system. In this step, the flow switching devices 141 and 142 were operated to allow the piping to connect with the exhaust tube 115, with the result that the gaseous stream thus formed was released to the exhaust side.

After the temperature of the Si substrate 102 was set at 450° C., with the inner pressure of the reaction chamber 101 maintained stable at 10 Torr, the flow chamber 101 maintained stable at 10 Torr, the flow switching devices 141 and 142 were simultaneously operated to permit the raw material gases to flow into the reaction chamber 101, thereby starting a depositing operation. The depositing operation was continued for 4 hours. After completion of the depositing operation, the flow switching devices 141 and 142 were simultaneously operated again to permit the raw material gases to flow into the discharge pipe 115. Also, the heating of the substrate 102 with the heater 103 was stopped so as to cool the substrate 102. During the cooling step of the substrate 102, the oxygen gas was allowed to flow through the reaction chamber.

Figure 10:
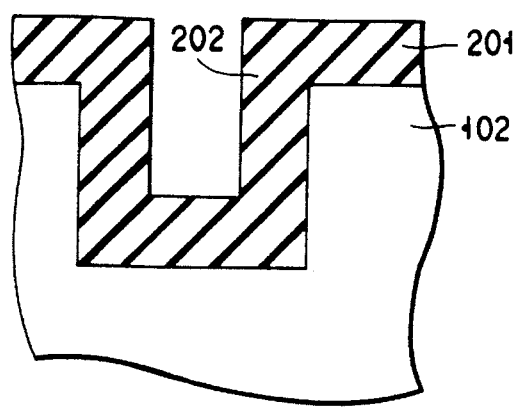
FIG. 10 is a cross sectional view showing a Si substrate having a $SrTiO_3$ thin film formed thereon in an example of the present invention under the conditions of reaction control.

A strontium titanate thin film about 100 nm thick was obtained by the operation described above. An induction coupled plasma emission spectroscopy (ICP method) was applied to the resultant thin film to confirm Sr/Ti=1. On the other hand, a peak other than that of strontium titanate was not observed in the X-ray diffractometry, indicating that the thin film was made of a polycrystalline strontium titanate. Further, a cross section of the substrate having the thin film formed thereon was observed with a scanning electron microscope. FIG. 10 schematically shows the result of the microscopic observation. As shown in the drawing, the $SrTiO_3$ thin film 201 on the flat portion and the $SrTiO_3$ thin film 202 on the side wall of the groove were found to be substantially equal to each other in thickness. Incidentally, the depositing temperature of 450° C. employed in this Example is included in the kinetically limited conditions, in which the growth rate is determined by the decomposing reaction of the raw materials.

Figure 11:
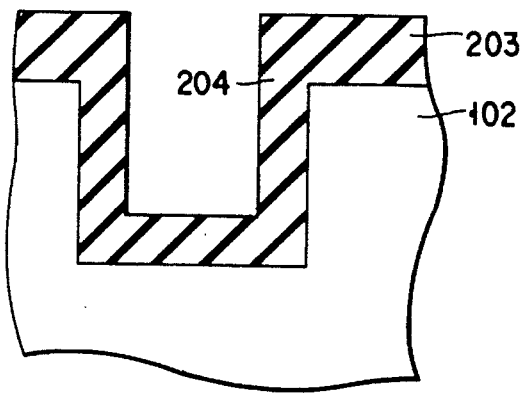
FIG. 11 is a cross sectional view showing a Si substrate having a SrTiO$_3$ thin film formed thereon in another example of the present invention under the mass transport limited conditions.

For comparison, a $SrTiO_3$ thin film was also formed as above, except that the deposition temperature was set at 600° C. to provide the mass transport limited conditions, in which the growth rate is determined by the supply rate of the raw materials. FIG. 11 shows the result. As shown in the drawing, the thickness of the thin film 204 formed on the side wall of the groove was found to be about 70% of the thickness of the thin film 203 formed on a flat portion.

Figure 12:
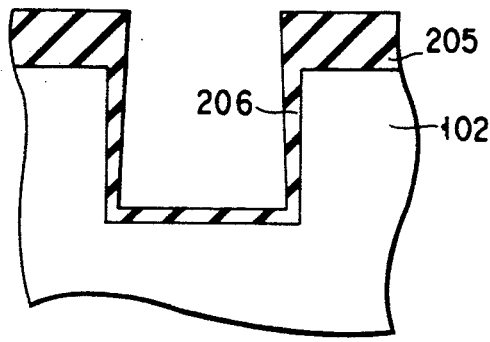
FIG. 12 is a cross sectional view showing, for comparison, a Si substrate having a SrTiO$_3$ thin film formed thereon by using Ti(OC$_3$H$_7$)$_4$ as a Ti raw material.

An additional experiment was conducted in an attempt to form a $SrTiO_3$ thin film. In this experiment, used was $Ti(OC_3H_7)_4$ as a Ti raw material together with $Sr(C_{11}H_{19}O_2)_2$ used as a Sr source as in Example 1. Where the deposition temperature was set at 600° C. included in the mass transport limited conditions, the thickness of the thin film 206 formed on the side wall of the groove was only about 30% of the thickness of the thin film 205 formed on a flat portion, as shown in FIG. 12. Further, where the deposition temperature was set at 450° C. included in the kinetically limited conditions, SrO and TiO were found to grow to form island regions separate from each other, resulting in failure to obtain a $SrTiO_3$ thin film.

As apparent from the experiments described above, a $SrTiO_3$ thin film excellent in step coverage can be obtained by using $Sr(C_{11}H_{19}O_2)_2$ as a Sr source and $TiO(C_{11}H_{19}O_2)_2$ as a Ti source, though it is impossible to obtain a satisfactory $SrTiO_3$ thin film in the case of using $Ti(OC_3H_7)_4$ as a Ti source. Further, a $SrTiO_3$ thin film substantially uniform in thickness over the entire region including the flat portion and the side wall portion of the groove can be obtained by setting the film-forming temperature to fall within the kinetically limited conditions.

EXAMPLE 2

A thin film of $Ba_xSr_{1-x}TiO_3$ was formed on a Si substrate having a stepped surface as in Example 1, except that used were $Ba(C_{11}H_{19}O_2)_2$ as a Ba source, $Sr(C_{11}H_{19}O_2)_2$ as a Sr source, and $TiO(C_{11}H_{19}O_2)_2$ as a Ti source.

Where the deposition temperature was set at 450° C., which is included in the kinetically limited conditions, the resultant $Ba_xSr_{1-x}TiO_3$ was found to be substantially uniform in thickness over the entire region including a flat portion and the side wall portion of the stepped surface of the substrate, as in the formation of the $SrTiO_3$ thin film. The value of x in the general formula of the compound forming the thin film was found to be 0.45 by the ICP analysis. Also, the ratio (Ba+Sr)/Ti was found to be 1 by the ICP analysis. Further, X-ray diffractometry revealed that the resultant thin film of $Ba_{0.45}Sr_{0.55}TiO_3$ was of a polycrystalline structure.

For comparison, thin films of $Ba_xSr_{1-x}TiO_3$ with different values of x were formed by changing the flow rates of the carrier gas into the Ba raw material vessel and the Sr raw material vessel and without changing the raw materials. It has been found that a thin film of $Ba_xSr_{1-x}TiO_3$ substantially uniform in thickness over the entire region including a flat portion and side wall portion can be formed regardless of the value of x, if the thin film is formed under the kinetically limited conditions.

EXAMPLE 3

Figure 13:
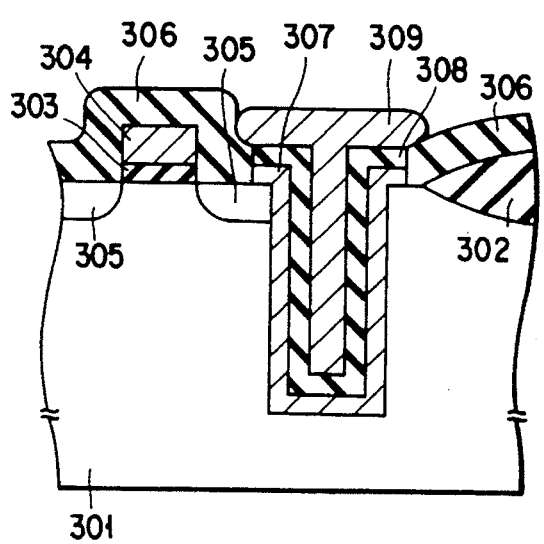
FIG. 13 is a cross sectional view showing a dynamic random access memory cell having a trench capacitor structure, which includes a thin film of Ba$_x$Sr$_{1-x}$TiO$_3$ manufactured by the method of the present invention as a capacitor insulating film.

A dynamic random access memory (DRAM) cell including a $Ba_xSr_{1-x}TiO_3$ thin film as a capacitor insulating film was prepared as follows in view of the result of Example 2. FIG. 13 shows a cross section of the DRAM cell.

In the first step, a field oxide film 302 for an isolation was formed on a (100) plane of a p-type silicon substrate 301. Then, a gate oxide film 303 was formed, followed by forming a polycrystalline silicon gate electrode 304 on the gate oxide 303. After formation of the gate electrode 304, source and drain regions 305 were formed by ion implantation, followed by forming an oxide film 306 as an interlayer dielectric film. These steps can be performed by the ordinary methods employed in this technical field such as the film formation, patterning by a photolithographic method, and ion implantation technique.

In the next step, a trench was formed in preparation for a trench capacitor formation, followed by forming a Pt film 307 acting as a lower electrode of a capacitor which is to be formed. Further, a thin film 308 of $Ba_{0.45}Sr_{0.55}TiO_3$ acting as a capacitor insulating film was formed on the Pt film 307 by a method similar to that employed in Example 2. The Pt film 307 (lower electrode) was about 20 nm thick, with the $Ba_{0.45}Sr_{0.55}TiO_3$ film 308 being 10 nm thick. Finally, a Pt film 309 was formed on the entire surface, followed by patterning the Pt film by the photolithographic method so as to form an upper electrode of a capacitor, thereby forming a desired memory cell.

As described above, the method of the present invention makes it possible to form a capacitor insulating film of a uniform thickness, which is made of $Ba_{0.45}Sr_{0.55}TiO_3$, on a substrate having a complex surface of a trench structure.

The capacitance of the memory cell manufactured as described above including the $Ba_{0.45}Sr_{0.55}TiO_3$ thin film 308 as a capacitor insulating film was found to be about 30 times as high as that of the conventional memory cell of a trench structure including a silicon oxide film or a silicon nitride film as a capacitor insulating film. This suggests that the method of the present invention permits forming a DRAM having a degree of integration about 30 times as high as that of the conventional DRAM.

EXAMPLE 4

Figure 14:
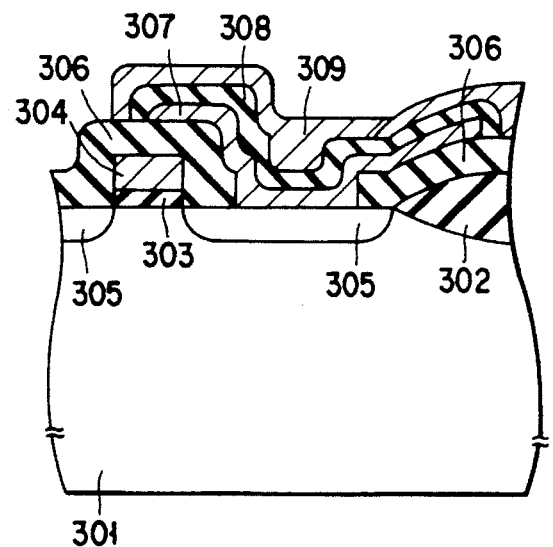
FIG. 14 is a cross sectional view showing a dynamic random access memory cell having a stacked capacitor structure, which includes a thin film of Ba$_x$Sr$_{1-x}$TiO$_3$ manufactured by the method of the present invention as a capacitor insulating film.

A DRAM cell including a $Ba_{0.5}Sr_{0.5}TiO_3$ film as a capacitor insulating film was prepared as in Example 3, except that the trench capacitor in Example 3 was replaced by a stacked capacitor. FIG. 8 shows a cross section of the DRAM cell prepared in Example 4. The reference numerals common with FIGS. 13 and 14 denote the same members of the device.

The method of the present invention makes it possible to form uniformly a capacitor insulating film made of $Ba_{0.5}Sr_{0.5}TiO_3$, which is included in a capacitor of a complex shape such as a stacked capacitor.

The capacitance of the memory cell including the $Ba_{0.5}Sr_{0.5}TiO_3$ thin film 308 as a capacitor insulating film was found to be about 30 times as high as that of the conventional memory cell of a stacked structure including a silicon oxide film or a silicon nitride film as a capacitor insulating film.

EXAMPLE 5

This Example was directed to one of the preferred embodiments of the present invention, which is highly effective for improving the surface smoothness of a capacitor insulating film exhibiting a high dielectric constant. Specifically, the CVD process employed in this Example was carried out at temperatures lower than the gaseous phase decomposition temperature of any of the metal compounds used as the raw materials. In this Example, a DRAM was prepared as described below with reference to FIGS. 15(A) to 15(F).

Figure 15A:
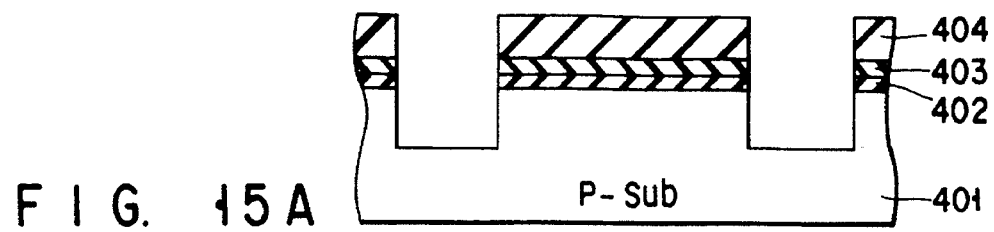
FIGS. 15A to 15F are cross sectional views collectively showing how to form a DRAM cell by the method of the present invention.

(1) A thermal oxide film 402 was formed on a p-type single crystalline silicon substrate 401 having a resistivity of 10 Ω.cm, followed by successively forming by CVD a polishing stopping layer 403 made of a silicon nitride film and a silicon oxide film 404 on the thermal oxide film 402. Then, the silicon oxide film 404 was patterned by the ordinary photo-etching technique. Further, the polishing stopping layer 403, the thermal oxide film 402 and the silicon substrate 401 were selectively etched by RIE using the silicon oxide pattern 404 as a mask so as to form a groove acting as an element separating region, as shown in FIG. 15(A).

Figure 15B:
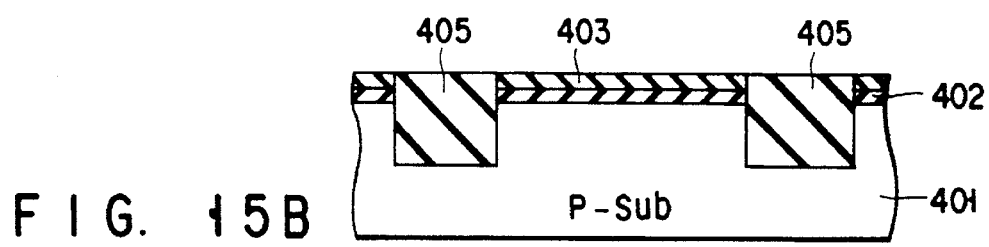

(2) Then, a silicon oxide film 405 was deposited on the entire surface to fill the groove providing the silicon oxide film 405 and the silicon oxide pattern 404 by a chemical mechanical polishing method so as to expose the polishing stopping layer 403 and to provide a flat surface, as shown in FIG. 15(B). As shown in the drawing, the groove was filled with the silicon oxide film 405 so as to achieve an element isolation.

(3) In the next step, the polishing stopping layer 403 was etched off, followed by further etching of the silicon thermal oxide film 402 with, for example, hydrofluoric acid. Then, a thermal oxidation was applied to the active region to form a gate oxide film 406 consisting of a thin thermal oxide film. Further, an n-type polycrystalline silicon (poly-Si) layer was deposited on the entire surface by LPCVD method, followed by patterning the poly-Si layer to form a gate electrode 407.

Figure 15C:
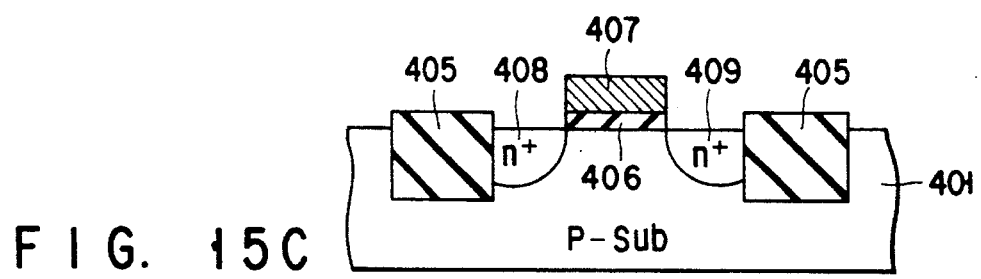

After formation of the gate electrode 407, an n-type impurity was introduced into the substrate surface region by ion implantation by using the gate electrode 407 and the isolation region 405 as a blocking mask, thereby forming source-drain regions (408, 409) apart from each other by self-alignment, as shown in FIG. 15(C).

Figure 15D:
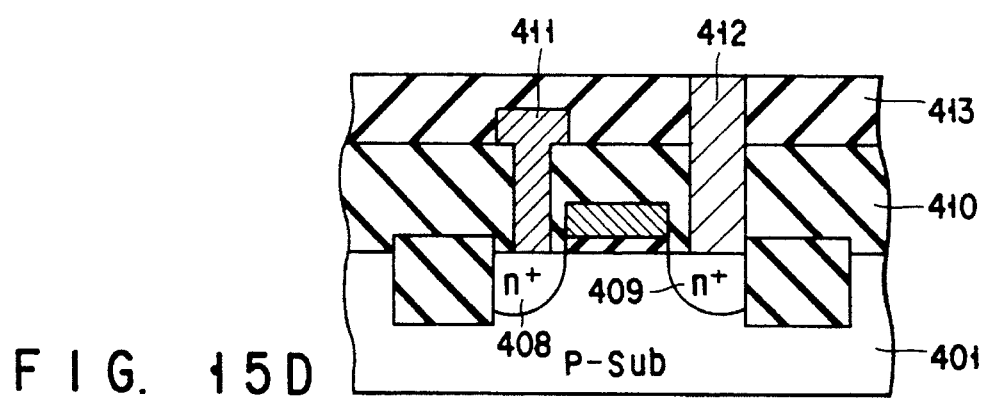

(4) In the next step, a thick CVD oxide film 410 acting as an interlayer dielectric film was formed on the entire surface, followed by forming a contact hole through the CVD oxide film 410 by the PEP process such through the CVD oxide film 410 by the PEP process such that the contact hole reached one of the source-drain regions (408, 409), i.e., region 408. Then, a tungsten silicide film was deposited and, then, patterned to form a bit line 411 filling the contact hole exposing the source-drain region 408. Further, a CVD oxide film 413 acting as an interlayer insulating film was formed on the entire surface, followed by forming a contact hole through the CVD oxide films 413 and 410 by the PEP process such that the contact hole thus formed reached the source-drain region 409. Still further, a tungsten film 412 was buried in the contact hole by a selective CVD, as shown in FIG. 15(D).

Figure 15E:
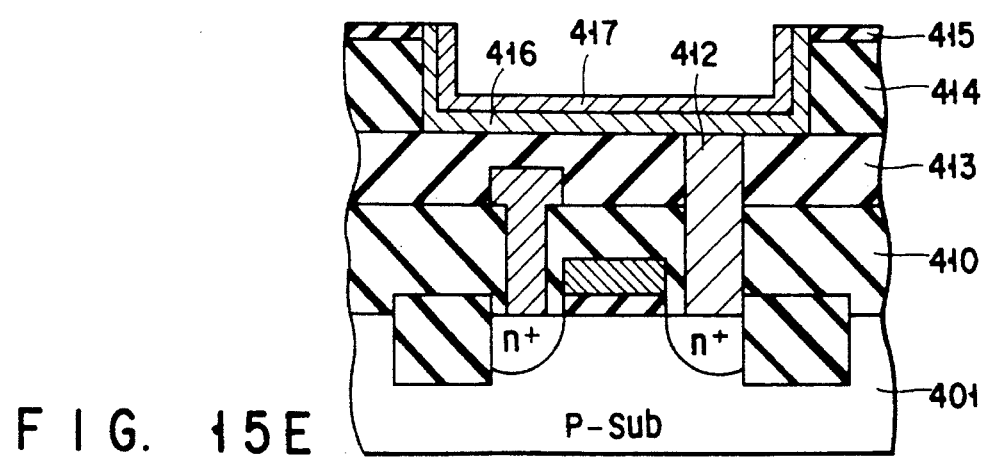

(5) In the next step, a CVD oxide film 414 was formed on the entire surface, followed by further forming a silicon nitride film 415 by a plasma CVD on the entire surface of the CVD oxide film 414. Then, these CVD oxide film 414 and silicon nitride film 415 were selectively etched by PEP until the tungsten film 412 was exposed, thereby forming a groove in which a capacitor included in a DRAM is to be formed. After the selective etching step, a tungsten nitride film 416 and a platinum film 417 were successively formed by sputtering on the entire surface, followed by selectively removing the platinum film 417 and the tungsten nitride film 416 by a chemical mechanical polishing method with the silicon nitride film 415 used as a polishing stopping layer, with the result that the platinum film 417 and the tungsten nitride film 416 were left unremoved only within the groove so as to form a lower electrode of a capacitor, as shown in FIG. 15(E).

Figure 15F:
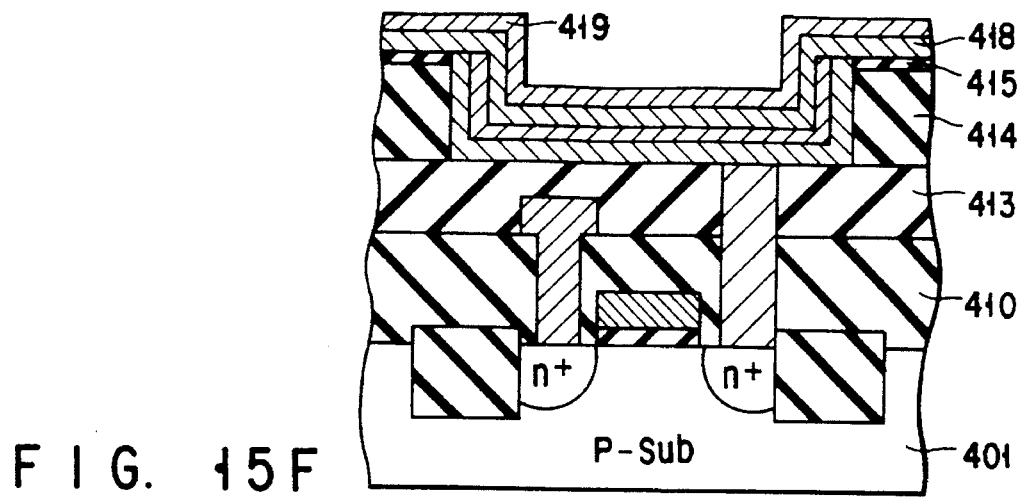

(6) Further, a strontium titanate film 418 acting as a capacitor insulating film was formed by CVD, followed by forming a titanium nitride film 419 on the strontium titanate film 418. Finally, the titanium nitride film 419 was patterned to form a plate electrode 419, as shown in FIG. 15(F).

Naturally, what is important in the manufacturing process described above is how to form the strontium titanate film 418. In this Example, the strontium titanate film 418 was formed as follows.

Specifically, the raw materials of $Sr(DPM)_2$ and $TiO(DPM)_2$, which were kept bubbled with an argon gas, were supplied to the reaction chamber. An oxygen gas was used as an oxidizing agent. The raw materials of $Sr(DPM)_2$ and $TiO(DPM)_2$ were maintained at 215° C. and 140° C., respectively, within ovens. The flow rate was 325 sccm for the carrier gas of Sr, 125 sccm for the carrier gas of Ti, and 50 sccm for the oxygen gas, the total gas flow rate being 500 sccm. The pressure in the deposition step was 10 Torr. An apparatus constructed as shown in FIG. 8, which was used in Example 1, was used for forming the strontium titanate film 418. The supply rate of $Sr(DPM)_2$ was 0.5 mmol/m$^2$. Under the film-forming conditions given above, the decomposition temperature of $Sr(DPM)_2$ in a gas phase was 440° C. Thus, the deposition temperature was set at 420° C., which is lower than the decomposition temperature 440° C. noted above.

The strontium titanate film 418 thus deposited was annealed within an oxygen plasma having a temperature of 400° C. and a pressure of 0.1 Torr. It should be noted that, since the film 418 was formed at a relatively low temperature, carbon remained unremoved within the film 418. However, the residual carbon was removed by the annealing treatment noted above. Then, the strontium titanate film 418 was crystallized by a rapid thermal oxidation method applied at 700° C. for one minute, so as to obtain a capacitor insulating film consisting of a highly dielectric thin film having a good step coverage and excellent in smoothness of the surface. The surface roughness of the film 418 was evaluated with AFM (atomic force microscope), with the result that the vertical distance between the top of the highest projection and the bottom of the deepest recess on the surface of the film 418 was only 0.5 nm or less.

(7) Further, a passivation film is formed and, then, a wiring is formed as required in accordance with the general process of manufacturing an LSI so as to manufacture an integrated circuit.

EXAMPLE 6

This Example is also directed to an embodiment in which the CVD process is carried out at temperatures lower than the decomposition temperature in a gas phase of any of the metal compounds used as the raw materials in order to enable a capacitor insulating film having a high dielectric constant to have a smooth surface. Let us describe this Example with reference to FIGS. 16(A) and 16(B).

Figure 16A:
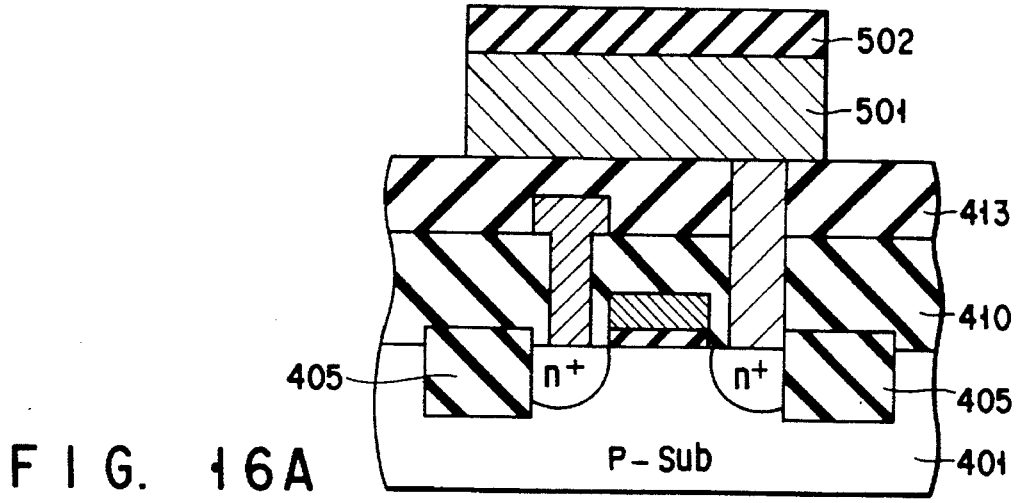
FIGS. 16A and 16B are cross sectional views collectively showing how to form another DRAM cell by the method of the present invention.

(1) The structure as shown in FIG. 15(D) was obtained by the steps (1) to (4) in Example 5. Then, a ruthenium oxide film 501 was deposited in a thickness of 1 μm on the CVD oxide film 413 by means of a sputtering technique, followed by depositing a CVD oxide film 502 on the ruthenium oxide film 501. Further, the CVD oxide film 502 was patterned, followed by applying RIE to the ruthenium oxide film 501 to achieve an anisotropic etching with the patterned CVD oxide film 510 used as a mask. As a result, the ruthenium oxide film 501 providing a lower electrode of a DRAM capacitor was patterned, as shown in FIG. 16(A).

Figure 16B:
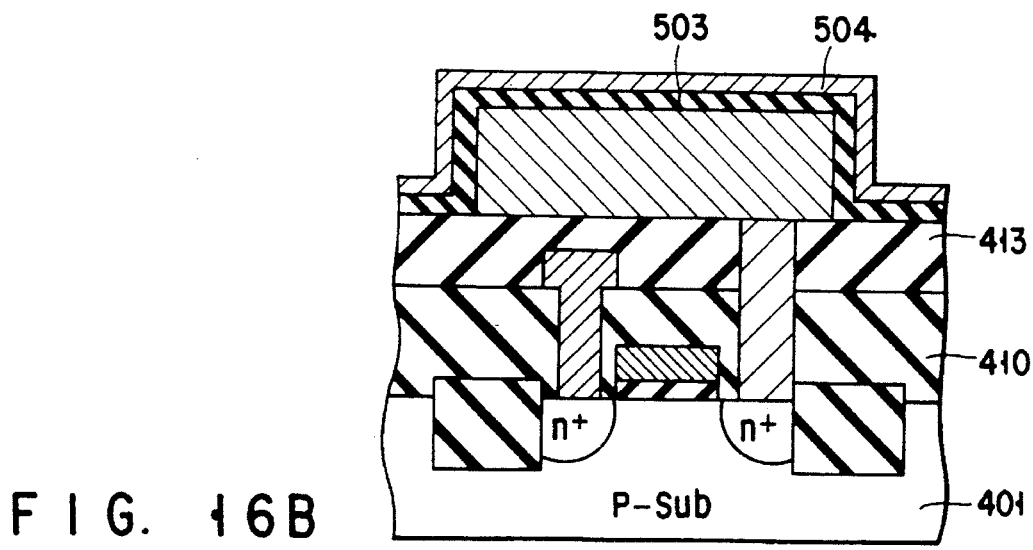

(2) In the next step, the CVD oxide film pattern 502 was removed, followed by forming a capacitor insulating film 503 made of strontium titanate by applying a preferred embodiment of the present invention. Further, a tungsten nitride film was deposited by CVD and, then, patterned to form a plate electrode 504 made of the tungsten nitride film, as shown in FIG. 16(B).

The capacitor insulating film 503 was formed as follows. In the first step, the raw materials of Sr(DPM)$_2$ and TiO(DPM)$_2$, which were maintained at 215° C. and 140° C., respectively, within ovens, were supplied to a CVD chamber of a cold wall type while being bubbled with an argon gas. An N$_2$O gas was used as an oxidizing agent. The supply conditions of the raw materials and the apparatus used were equal to those in Example 5. It should be noted that the decomposition temperature of Sr(DPM)$_2$ in a gas phase was 460° C. Thus, the deposition temperature was set at 440° C., which is lower than the decomposition temperature of 460° C. given above, so as to deposit the strontium titanate film 503. The film 503 thus formed was annealed at 600° C. for 30 minutes under an oxygen atmosphere so as to crystallize the film 503. As a result, obtained was a capacitor insulating film made of a highly dielectric thin film of strontium titanate and exhibiting a good step coverage and an excellent surface smoothness. The surface roughness of the film 503 was evaluated with AFM, with the result that the vertical distance between the top of the highest projection and the bottom of the deepest recess on the surface of the film 418 was only 0.2 nm or less.

(3) Further, a passivation film is formed and, then, a wiring is formed as required in accordance with the general process of manufacturing an LSI so as to manufacture an integrated circuit.

EXAMPLE 7

This Example is directed to an embodiment in which the CVD process is performed under the kinetically limited conditions in order to form a capacitor insulating film of a good perovskite crystal structure having a high dielectric constant and a good step coverage. Specifically, the CVD process is controlled in this Example such that the molar amount of the Sr raw material supplied to the CVD chamber is at least 5 times as much as that of the Ti raw material.

Figure 17:
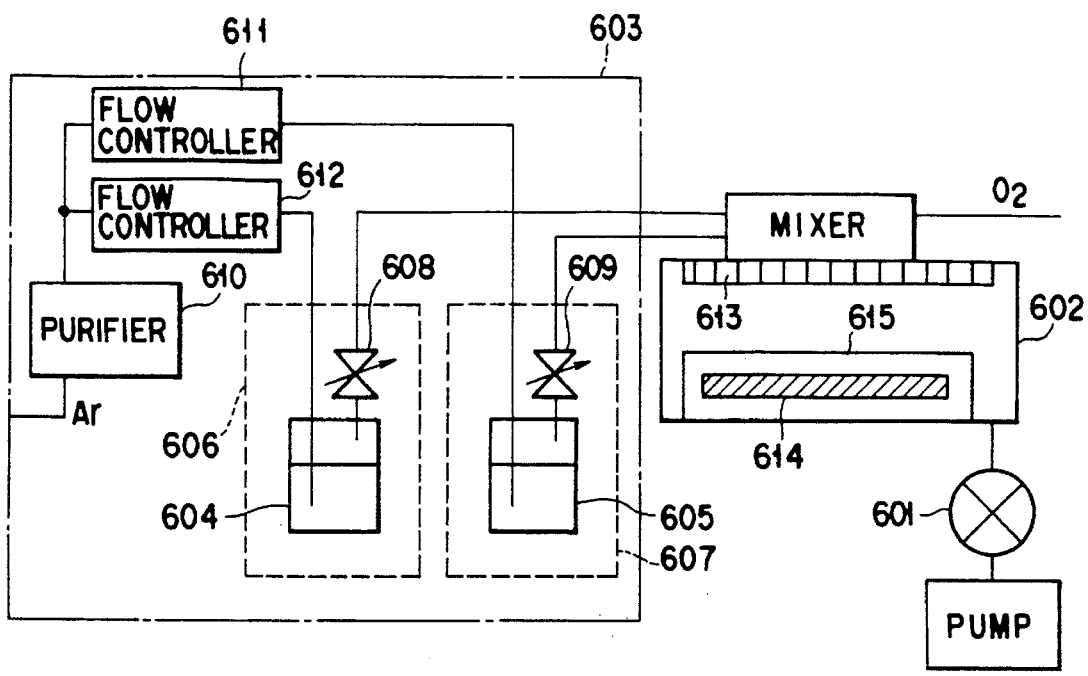
FIG. 17 schematically shows the construction of a chemical vapor deposition apparatus used for forming a dielectric thin film by another embodiment of the present invention.

In this Example, a CVD apparatus shown in FIG. 17 was used for forming a strontium titanate thin film. As shown in the drawing, the CVD apparatus comprises a exhaust system 601, a reaction chamber 602, and a gas supply system 603. Used as the raw materials were Sr(DPM)$_2$ and TiO(DPM)$_2$. Also, an oxygen gas (O$_2$) was used as an oxidizing agent.

The raw materials of Sr(DPM)$_2$ and TiO(DPM)$_2$ were housed in stainless steel vessels 604 and 605, respectively. These vessels 604 and 605 were housed in ovens 606 and 607, respectively. It was possible to control independently the temperature of these ovens 606 and 607. Since the raw material vessels were housed in the ovens, it was possible to control very accurately the temperature of the raw materials. As shown in the drawing, pressure control valves 608 and 609 were mounted to the outlet ports of the raw material vessels 604 and 605, respectively, making it possible to control the pressure within each of the raw material vessels. The raw material was bubbled with an argon gas for supplying the raw material to the reaction vessel.

It should be noted that an argon gas was purified in a purifying apparatus 610 and, then, supplied through mass flow controllers 611 and 612 into the raw material vessels 604 and 605 so as to achieve bubbling of the raw materials within these vessels 604 and 605. Naturally, the flow rate of the argon gas was controlled when the argon gas flowed through the mass flow controllers 611 and 612. The evaporated raw materials were carried by the argon gas so as to be mixed with an oxygen gas O$_2$ in the front stage of the reaction chamber 602 and, then, enter the reaction vessel 602 through a shower nozzle 613. When a CVD reaction took place within the reaction chamber 602, a thin film of strontium titanate was formed on the surface of a substrate disposed on a susceptor 615 held at a predetermined temperature by a heater 614.

In order to obtain a good step coverage and achieve a good perovskite crystal structure, the CVD process was carried out under the conditions described below. Specifically, the temperatures of Sr(DPM)$_2$ and TiO(DPM)$_2$ were kept at 215° C. and 140° C., respectively. Also, the inner pressure of the raw material vessels 604 and 605 housing these raw materials was maintained at 100 Torr. The carrier gas flow rate was 300 sccm for Sr and 35 sccm for Ti. Under these conditions, the raw material of Sr(DPM)$_2$ was supplied to the substrate at a rate of 5 mmol/m$^2$, with the other raw material of TiO(DPM)$_2$ being supplied to the substrate at a rate of 50 mmol/m$^2$. Also, in order to achieve a good step coverage, the CVD process for forming a strontium titanate thin film was performed under a deposition temperature of 420° C., a deposition pressure of 10 Torr, and a total flow rate of 500 sccm such that the films for Sr and Ti would be formed under the kinetically limited conditions.

Then, the strontium titanate thin film thus formed was annealed under an oxygen gas atmosphere of 700° C. so as to crystallize the deposited film. The resultant strontium titanate thin film was found to exhibit a good step coverage and have a good perovskite crystal structure. Further, when the dielectric constant of the strontium titanate thin film was measured by using upper and lower electrodes each made of platinum, a sample film having a thickness of 50 nm was found to have a dielectric constant as high as 200, and another sample film having a thickness of 25 nm was found to have a dielectric constant as high as 170.

EXAMPLE 8

This Example is also directed to an embodiment which permits forming a capacitor insulating film having a high dielectric constant, said film having a good step coverage and maintaining a good perovskite crystal structure, as in Example 7.

Figure 18:
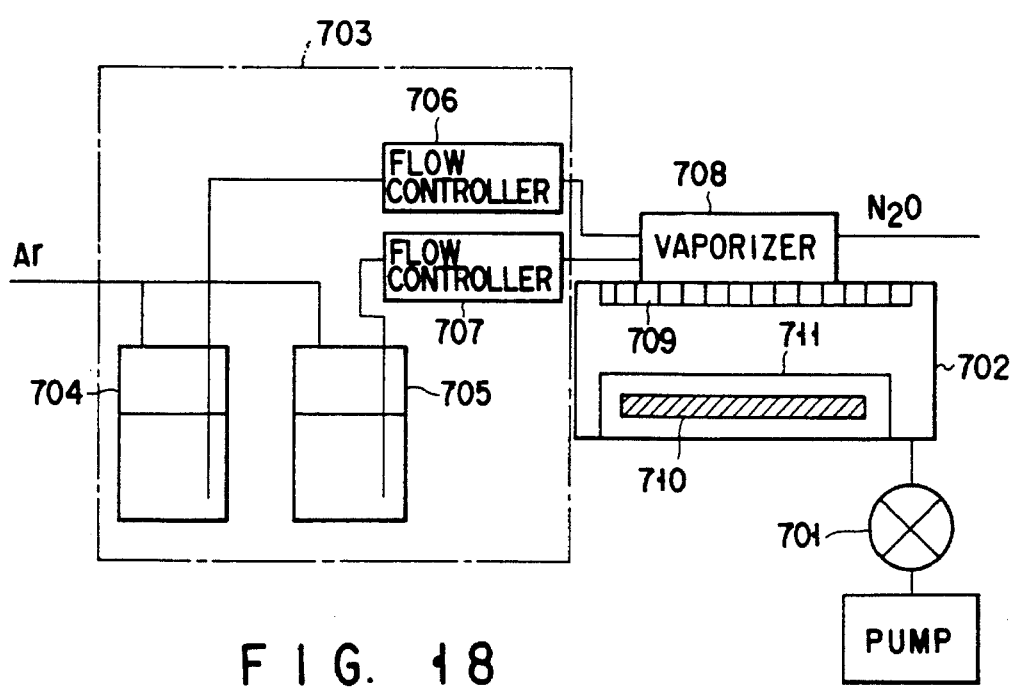
FIG. 18 schematically shows the construction of a chemical vapor deposition apparatus used for forming a dielectric thin film by still another embodiment of the present invention.

In this Example, a CVD apparatus shown in FIG. 18 was used for forming a strontium titanate thin film. As shown in the drawing, the CVD apparatus comprised a discharge system 701, a reaction chamber 702 and a liquid supply system 703. The metal raw materials used were $Sr(DPM)_2$ and $TiO(DPM)_2$. Further, $N_2O$ was used as an oxidizing agent.

The metal raw materials of $Sr(DPM)_2$ and $TiO(DPM)_2$ were dissolved in tetrahydrofuran and housed in the form of solutions in stainless steel raw material vessels 704 and 705, respectively. The concentration of the metal raw material in the solution was 0.01 mol/l in each of these two solutions. The surfaces of the raw material solutions in the raw material vessels 704 and 705 were pressurized with an argon gas to cause these solutions to be forwarded through flow rate controllers 706 and 707 into a vaporizer 708 maintained at 250° C. All the piping leading to the vaporizer 708 was kept at room temperature.

The raw material solutions introduced into the vaporizer 708 were vaporized in the vaporizer and, then, transferred by an argon gas so as to be mixed with $N_2O$ in a former stage of the reaction chamber 702. Further, the mixed gas is introduced into the reaction chamber 702 through a shower nozzle 709. When a CVD reaction took place within the reaction vessel, a thin film of strontium titanate was formed on the surface of a substrate disposed on a susceptor 711 held at a predetermined temperature by a heater 710.

In order to obtain a good step coverage and achieve a good perovskite crystal structure, the CVD process for forming the capacitor insulating film was conducted as follows. Specifically, the raw material solutions of $Sr(DPM)_2$ and $TiO(DPM)_2$ were supplied at flow rates of 0.005 sccm and 0.025 sccm, respectively. The supply rates of the metal raw materials to the substrate under the flow rates given above were 50 mmol/m² for $Sr(DPM)_2$ and 250 mmol/m² for $TiO(DPM)_2$. Also, the partial pressures within the reaction vessel were 0.1 Torr for Sr $(DPM)_2$ and 0.5 Torr for $TiO(DPM)_2$, respectively. As described previously, it is necessary to carry out the film-forming reactions of Sr and Ti under the kinetically limited conditions in order to achieve a good step coverage. To meet these conditions, the CVD for forming the strontium titanate thin film was conducted under a depositing temperature of 450° C., and a depositing pressure of 50 Torr.

Then, the strontium titanate thin film thus formed was annealed under an oxygen gas atmosphere of 700° C. so as to crystallize the formed film. The resultant strontium titanate thin film was found to exhibit a good step coverage and have a good perovskite crystal structure. Further, when the dielectric constant of the strontium titanate thin film was measured by using upper and lower electrodes each made of platinum, a sample film having a thickness of 50 nm was found to have a dielectric constant as high as 200, and another sample film having a thickness of 25 nm was found to have a dielectric constant as high as 170. These values were as high as those obtained by the conventional sputtering method (K. Abe et al., J. Appl. Phys., 32, 4186 (1993)).

The method of the present invention is not limited to the Examples described above. It is possible to modify the technique of the present invention in various fashions within the technical scope of the present invention. For example, it has been experimentally confirmed by the present inventors that a nitrogen gas ($N_2$) or a helium gas (He) can also be used as a carrier gas in conducting the chemical vapor deposition included in the method of the present invention.

Also, in the Examples described above, DPM, i.e., $C_{11}H_{19}O_2$, was used as the β-diketone ligand of the complex compounds used as the raw materials. In addition, it is also possible to use, for example, HFA, i.e., $C_5HF_6O_2$, as the β-diketone ligand. The present inventors have confirmed that a satisfactory result can be obtained as far as a β-diketone complex compound of Ba, Sr or Ti is used as a raw material.

Further, an oxygen gas ($O_2$) used as an oxidizing agent in the Examples described above can be replaced by nitrogen oxides ($N_xO_y$) such as $N_2O$, $NO_2$ and NO as well as by $O_3$, $C_4H_4O$ or $C_4H_8O$. It is also possible to activate these gases with plasma or light before use as an oxidizing agent. The present inventors have found that a satisfactory result can be obtained in the case of using these gases other than an oxygen gas.

Still further, each of the upper and lower electrodes included in the capacitor formed in the Examples described above was made of platinum. However, the electrode material need not be limited to platinum. For example, platinum can be replaced by another metal such as Ir, conductive metal oxides such as $PtO_x$, and $IrO_x$, and metal oxides such as $SrTiO_3$ and ITO, which are enabled to exhibit an electrical conductivity by Nd addition. Of course, the method of the present invention can be employed for manufacturing semiconductor devices other than DRAM, though manufacture of DRAM is exemplified in the foregoing description.

As described above in detail, the method of the present invention makes it possible to form uniformly a dielectric thin film on a substrate having a stepped portion, said dielectric thin film being made of a compound represented by the general formula $ABO_3$, where "A" is at least one element selected from the group consisting of Ca, Ba, Sr, Pb and La, and "B" is at least one element selected from the group consisting of Zr and Ti. This makes it possible to use a dielectric thin film made of, for example, $SrTiO_3$, $Ba_xSr_{1-x}TiO_3$ or PZT, which exhibits a dielectric constant higher than that of the conventional material of $SiO_2$ or $Si_3N_4$, as an capacitor insulating film included in a semiconductor device, e.g., included in a capacitor of a complex three dimensional structure such as a trenched capacitor or a stacked capacitor. It follows that it is possible to obtain a semiconductor device having a degree of integration markedly higher than that in the past.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the step of forming a dielectric thin film on a semiconductor layer, said dielectric thin film being made of a compound represented by the general formula (1) given below:

$$ABO_3 \tag{1}$$

where "A" is at least one element selected from the group consisting of Ca, Ba, Sr, Pb and La, and "B" is at least one element selected from the group consisting of Zr and Ti,
   wherein said dielectric thin film is formed by a chemical vapor deposition carried out under the kinetically limited conditions in which a pressure is 400 Torr or less and a temperature is 1,000° C. or less by using a raw material gas containing a β-diketone complex compound of said element A, a β-diketone complex compound of said element B, and an oxidizing agent; and
   wherein the supply amount of said β-diketone complex compound of said element B is at least 5 times as much in molar ratio as the supply amount of said β-diketone complex compound of said element A so as to form said dielectric thin film in which the element ratio A/A+B is substantially equal to stoichiometric ratio of 0.5.

2. The method of manufacturing a semiconductor device according to claim 1, wherein said chemical vapor deposition is carried out under temperatures lower than the thermal decomposition temperature of any of said β-diketone complex compound of said element A and said β-diketone complex compound of said element B.

3. The method of manufacturing a semiconductor device according to claim 1, wherein said chemical vapor deposition is carried out under the condition that the supply amount of said β-diketone complex compound of said element B is at least 10 times as much in molar ratio as the supply amount of said β-diketone complex compound of said element A.

4. The method of manufacturing a semiconductor device according to claim 1, wherein the compound represented by said general formula (1) is $Ba_xSr_{1-x}TiO_3$ ($0 \leq x \leq 1$).

5. The method of manufacturing a semiconductor device according to claim 1, wherein the β-diketone ligand of at least one of said two complex compounds is dipivaloylmethane (DPM; $C_{11}H_{19}O_2$).

6. The method of manufacturing a semiconductor device according to claim 1, wherein said oxidizing agent includes oxygen molecules or $N_2O$.

7. The method of manufacturing a semiconductor device according to claim 1, wherein the β-diketone ligands of said two complex compounds are dipivaloylmethane.

* * * * *